(12) United States Patent
Chun et al.

(10) Patent No.: US 8,298,843 B2
(45) Date of Patent: Oct. 30, 2012

(54) ARRAY SUBSTRATE FOR LIQUID CRYSTAL DISPLAY DEVICE AND METHOD OF FABRICATING THE SAME

(75) Inventors: Ki-Chul Chun, Gyeongsangbuk-do (KR); Hwan Kim, Daegu (KR); Deuk-Soo Jung, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 90 days.

(21) Appl. No.: 12/943,345

(22) Filed: Nov. 10, 2010

(65) Prior Publication Data

US 2011/0114955 A1     May 19, 2011

(30) Foreign Application Priority Data

Nov. 17, 2009   (KR) .................. 10-2009-0110704

(51) Int. Cl.
*H01L 21/00* (2006.01)
(52) U.S. Cl. .................. 438/30; 257/E33.004
(58) Field of Classification Search .................. 438/158, 438/30, 34; 257/E33.053, E33.004
See application file for complete search history.

(56) References Cited

U.S. PATENT DOCUMENTS

2008/0116459 A1 * 5/2008 Chen et al. .................. 257/59
* cited by examiner

*Primary Examiner* — Shaun Campbell
(74) *Attorney, Agent, or Firm* — Morgan, Lewis & Bockius LLP (57) ABSTRACT

An array substrate includes first and second lines on a substrate and formed of a metallic material; a gate electrode connected to the first line; a gate insulating layer on the first and second lines and the gate electrode and including a groove exposing the substrate and positioned between the first and second lines; a semiconductor layer on the gate insulating layer and corresponding to the gate electrode; a data line crossing the first and second lines and on the gate insulating layer; a source electrode connected to the data line; a drain electrode spaced apart from the source electrode; a passivation layer on the data line, the source electrode and the drain electrode and including an opening, the opening exposing the gate insulating layer and the drain electrode; and a pixel electrode positioned on the gate insulating layer and in the opening and contacting the drain electrode.

10 Claims, 12 Drawing Sheets

ARRAY SUBSTRATE FOR LIQUID CRYSTAL DISPLAY DEVICE AND METHOD OF FABRICATING THE SAME

The present application claims the benefit of Korean Patent Application No. 10-2009-0110704 filed in Korea on Nov. 17, 2009, which is hereby incorporated by reference.

BACKGROUND OF THE INVENTION

1. Field of the Invention

The present invention relates to a liquid crystal display (LCD) device and more particularly to an arrays substrate being capable of preventing an electrical shortage problem and a method of fabricating the array substrate.

2. Discussion of the Related Art

Recently, the LCD devices having characteristics of light weight, thinness and low power consumption are introduced. Among these LCD devices, the LCD device including a thin film transistor (TFT) as a switching element, referred to as an active matrix LCD (AM-LCD) device, has excellent characteristics of high resolution and displaying moving images such that the AM-LCD device are widely used.

Generally, the LCD devices are fabricated by an array substrate process, a color filter substrate process and a cell process. In the array substrate process, a TFT and a pixel electrode are formed on a first substrate such that an array substrate is obtained. In the color filter substrate process, a color filter and a common electrode are formed on a second substrate such that a color filter substrate is obtained. Then, in the cell process, a liquid crystal layer is interposed between the first and second substrates.

Figure 1:
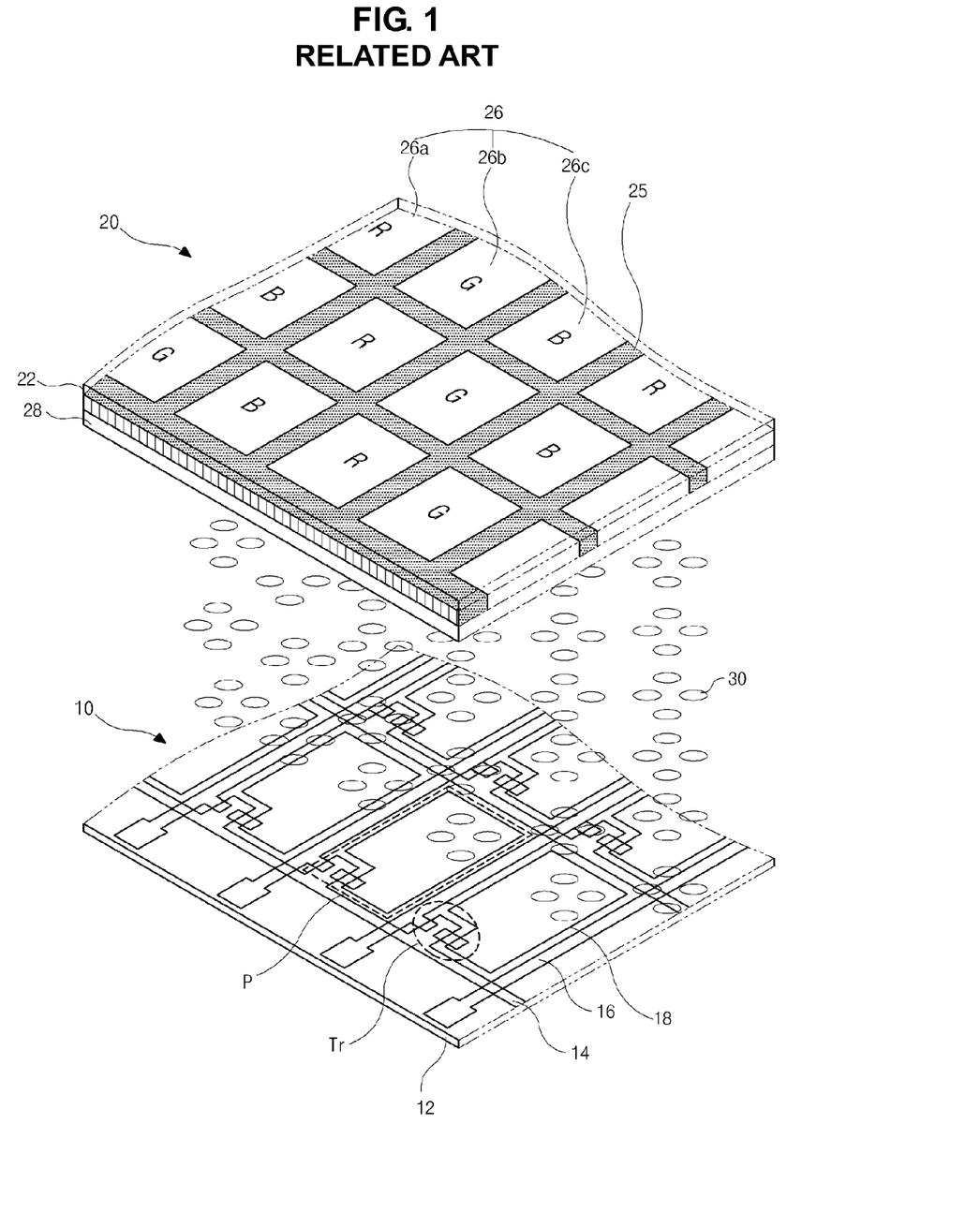
FIG. 1 is an exploded perspective view of the related art LCD device.

FIG. 1 is an exploded perspective view of the related art LCD device. In FIG. 1, The LCD device includes first and second substrates 12 and 22, and a liquid crystal layer 30. The first and second substrates 12 and 22 face each other, and the liquid crystal layer 30 is interposed therebetween.

The first substrate 12 includes a gate line 14, a data line 16, a TFT "Tr", and a pixel electrode 18. The first substrate 12 including these elements is referred to as an array substrate 10. The gate line 14 and the data line 16 cross each other such that a region is formed between the gate and data lines 14 and 16 and is defined as a pixel region "P". The TFT "Tr" is formed at a crossing portion of the gate and data lines 14 and 16, and the pixel electrode 18 is formed in the pixel region "P" and connected to the TFT "Tr".

The second substrate 22 includes a black matrix 25, a color filter layer 26, and a common electrode 28. The second substrate 22 including these elements is referred to as a color filter substrate 20. The black matrix 25 has a lattice shape to cover a non-display region of the first substrate 12, such as the gate line 14 and the data line 16 on the first substrate 12. A light leakage in the non-display region is blocked by the black matrix 25. The color filter layer 26 includes first, second, and third sub-color filters 26a, 26b, and 26c. Each of the sub-color filters 26a, 26b, and 26c has one of red, green, and blue colors R, G, and B and corresponds to the each pixel region "P". The common electrode 28 is formed on the black matrix 25 and the color filter layers 26 and over an entire surface of the second substrate 22.

Although not shown, edges of the first and second substrates 12 and 22 are sealed such that a leakage of the liquid crystal layer 30 is prevented. First and second alignment layers for controlling an initial arrangement of the liquid crystal molecules in the liquid crystal layer 30 are formed on the first and second substrates 12 and 22, respectively. A polarizing plate is formed on at least one outer side of the first and second substrates 12 and 22. In addition, a backlight unit for providing light is disposed under the first substrate 12.

When the TFT "Tr" is turned on by a signal through the gate line 14, a signal is applied to the pixel electrode 18 through the data line 16 such that a vertical electric field is induced between the pixel and common electrode 18 and 28. As a result, the liquid crystal layer 30 is driven by a vertical electric such that the LCD device can produce images.

Figure 2:
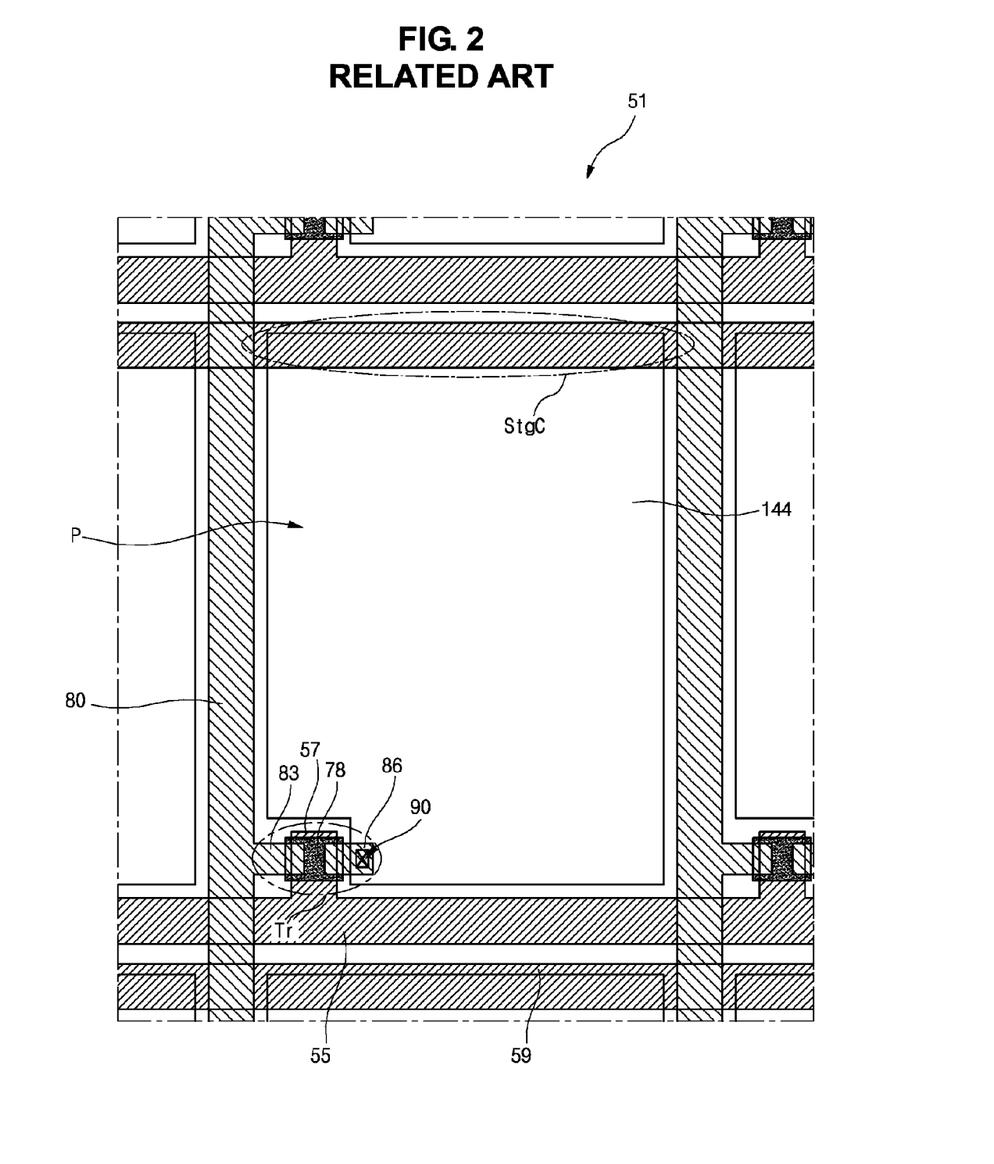
FIG. 2 is a plane view showing one pixel region of an array substrate for the related art LCD device.

FIG. 2 is a plane view showing one pixel region of an array substrate for the related art LCD device. In FIG. 2, a gate line 55 and a data line 80 are disposed on a substrate 51. The gate and data lines 55 and 80 cross each other to define a pixel region "P". A TFT "Tr", which is connected to the gate and data lines 55 and 80, as a switching element is disposed in the pixel region "P". In addition, a common line 59, which is formed of the same material and disposed on the same layer as the gate line 58, is disposed on the substrate 51. The common line 59 is parallel to and spaced apart from the gate line 58.

The TFT "Tr" includes a gate electrode 57, a semiconductor layer 78, a source electrode 83 and a drain electrode 86. A pixel electrode 93 is connected to the drain electrode 86 through a drain contact hole 90. The pixel electrode 93 overlaps the common line 59 to form a storage capacitor "StgC".

As mentioned above, the common line 59 is disposed on the same layer as the gate line 58. Namely, the gate line 58 and the common line 59 are formed by patterning a metal layer (not shown) on the substrate 51. When there is a defect, for example, particles, on a patterning process, there is an electrical short problem between the gate line 58 and the common line 59. The electrical short problem is not remedied by following processes, for example, a process of forming the semiconductor layer 78, a process of forming the source and drain electrodes 83 and 86 and a process of forming the pixel electrode 93.

To remedy the electrical short problem, a repair process for cutting the electrical short portion by irradiating a leaser beam is required. Or, an additional mask process, which includes a step of forming a photoresist (PR) layer, a step of exposing the PR layer, a step of developing the exposed PR layer, and a step of etching the metal layer, for removing the electrical short portion, is required. As a result, the production costs are increased and the production yield is decreased because of the electrical short problem. The electrical short problem may be generated not only the gate and common lines 58 and 59 but also other electric lines.

SUMMARY OF THE INVENTION

Accordingly, the present invention is directed to an array substrate for an LCD device and a method of fabricating the same that substantially obviates one or more of the problems due to limitations and disadvantages of the related art.

An object of the present invention is to provide an array substrate for an LCD device being capable of preventing an electrical short problem.

An object of the present invention is to provide a fabricating process of an array substrate for an LCD device being capable of reducing production costs.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a liquid crystal display device includes first and second lines on a substrate and spaced apart from each other, the first and second lines formed of a first metallic material; a gate electrode connected to the first line; a gate insulating layer on the first and second lines and the gate electrode and including a groove, the groove exposing the substrate and positioned between the first and second lines; a semiconductor layer on the gate insulating layer and corresponding to the gate electrode; a data line crossing the first and second lines and on the gate insulating layer; a source electrode on the semiconductor layer and connected to the data line; a drain electrode on the semiconductor layer and spaced apart from the source electrode; a passivation layer on the data line, the source electrode and the drain electrode and including an opening, the opening exposing a portion of the gate insulating layer and an end of the drain electrode; and a pixel electrode positioned on the gate insulating layer and in the opening, the pixel electrode contacting the end of the drain electrode.

In another aspect of the present invention, a method of fabricating an array substrate for a liquid crystal display device includes forming a first line, and a second line and a gate electrode on a substrate, the first and second lines spaced apart from each other, the gate electrode connected to the gate line, the first line, the second line and the gate electrode formed of a first metallic material; forming a gate insulating layer on the first and second lines and the gate electrode, an active layer on the gate insulating layer and an impurity-doped amorphous silicon pattern on the active layer, the gate insulating layer including a grove, the active layer and the impurity-doped amorphous silicon pattern corresponding to the gate electrode, wherein the groove exposes the substrate and is positioned between the first and second lines; forming a data line on the gate insulating layer and source and drain electrodes on the impurity-doped amorphous silicon pattern, the data line crossing the first and second lines, the source electrode connected to the data line and spaced apart from the drain electrode; etching a portion of the impurity-doped amorphous silicon pattern using the source and drain electrode as an etching mask; forming a passivation layer, which is disposed on the data line, the source electrode and the drain electrode and includes an opening exposing a portion of the gate insulating layer and an end of the drain electrode, and a pixel electrode on the gate insulating layer and in the opening, wherein the pixel electrode contacts the end of the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

Figure 3:
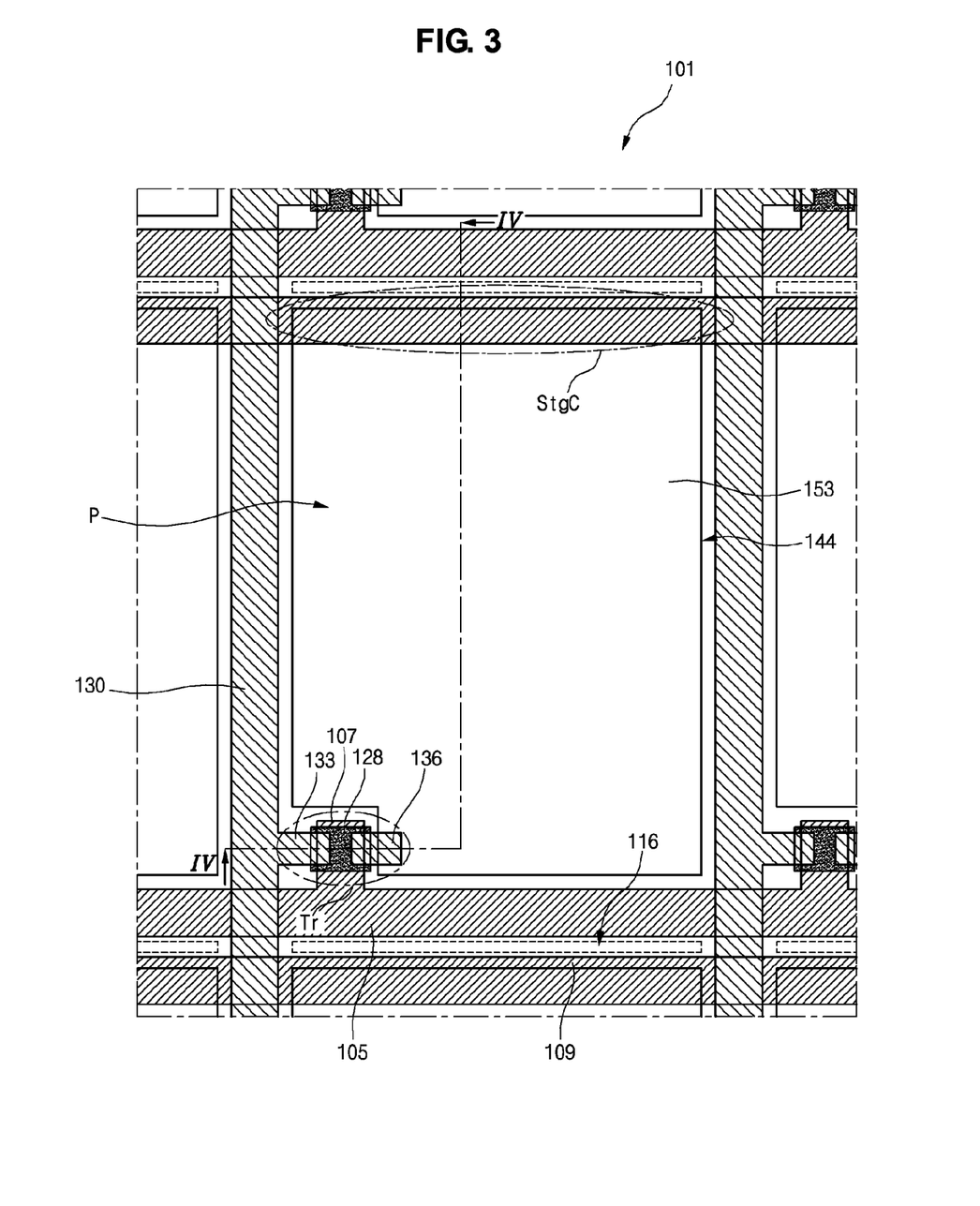
FIG. 3 is a plane view showing one pixel region of an array substrate for an LCD device according to the present invention.
Figure 4:
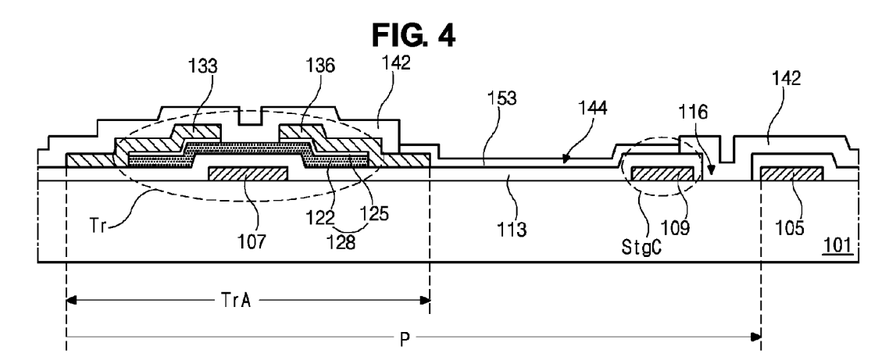
FIG. 4 is a cross-sectional view taken along the line IV-IV of FIG. 3.

FIG. 3 is a plane view showing one pixel region of an array substrate for an LCD device according to the present invention, and FIG. 4 is a cross-sectional view taken along the line IV-IV of FIG. 3. FIG. 3 shows a gate line and a common line disposed adjacent to each other. On the other hand, two gate lines may be disposed adjacent to each other. In this case, a principle for preventing an electrical short is also applied. A switching region, where a TFT as a switching element is formed, is defined in FIG. 4.

In FIGS. 3 and 4, a gate line 105 and a common line 109 along a first direction are disposed on a substrate 101. The common line 109 is adjacent to the gate line 105 and spaced apart from the gate line 105 by a distance. For example, the distance between the common line 109 and the gate line 105 may be 7 to 12 micrometers. In addition, a gate electrode 107, which is connected to the gate line 105, is disposed on the substrate 101 and in the switching region TrA.

A gate insulating layer 113 is disposed on the gate line 105, the gate electrode 107 and the common line 109. The gate insulating layer 113 has a groove 116 of a bar shape. The groove 116 is disposed between the gate line 105 and the common line 109 and has a width smaller than the distance between the gate line 105 and the common line 109. Namely, a portion of the substrate 101 between the gate line 105 and the common line 109 is not covered by the gate insulating layer 113. A major axis of the groove 116 is parallel to the gate line 105. A minor axis of the groove 116 has the width smaller than the distance between the gate line 105 and the common line 109.

A data line 130 is disposed on the gate insulating layer 113 and crosses the gate line 105 to define a pixel region P. A length of the major axis of the groove 116 is smaller than a distance between two adjacent data lines 130 such that the groove 116 does not overlap the data lines 130. In the switching region TrA, a semiconductor layer 128 including an active layer 122 and an ohmic contact layer 125 is disposed on the gate insulating layer 113. In addition, a source electrode 133 and a drain electrode 136 is disposed on the semiconductor layer 128. The source and drain electrodes 133 and 136 are spaced apart from each other. A center portion of the active layer 128 is exposed through a space between the source and drain electrodes 133 and 136. The exposed portion of the active layer 128 serves as a channel. The source electrode 133 is connected to the data line 130. The gate electrode 107, the gate insulating layer 113, the semiconductor layer 128, the source electrode 133 and the drain electrode 136 in the switching region TrA constitute a thin film transistor (TFT) Tr.

FIG. 3 shows the channel of I shape. However, there is no limitation in a shape of the channel. For example, the source electrode 133 has a U shape and the drain electrode 136 is inserted into the U shape such that the channel has a U shape. On the other hand, FIG. 3 shows the switching region TrA is positioned in the pixel region P. Alternatively, a portion of the gate line 105 serves as the gate electrode 107 such that the switching region TrA is positioned on the gate line 105.

A passivation layer 142 is disposed on the TFT Tr and the data line 130. The passivation layer 142 has an opening 144 to expose an end of the drain electrode 136 and the gate insulating layer 113 in the pixel region P. The passivation layer 142 is disposed in the groove 116 of the gate insulating layer 113. As a result, the passivation layer 142 in the groove 116 contacts the substrate 101.

A pixel electrode 153 is disposed in the opening 144 of the passivation layer 142 and on the gate insulating layer 113. The pixel electrode 153 contacts the end of the drain electrode 136. The pixel electrode 153 overlaps the common line 109 with the gate insulating layer therebetween to form a storage capacitor StgC.

In the present invention, the groove 116 is formed between the lines, which are disposed at the same layer as and adjacent to each other. Even if an electrical short problem, which resulted by a particle, is generated, the electrical short portion is removed when the groove 116 is formed. Accordingly, the electrical short problem is never generated.

FIGS. 5A to 5D are plane views showing a fabricating process of an array substrate for an LCD device according to the present invention, and FIGS. 6A to 6L are cross-sectional views showing a fabricating process of an array substrate for an LCD device according to the present invention. FIGS. 6A to 6L show a pixel region, a gate link region, a gate pad region and a data pad region.

Figure 5A:
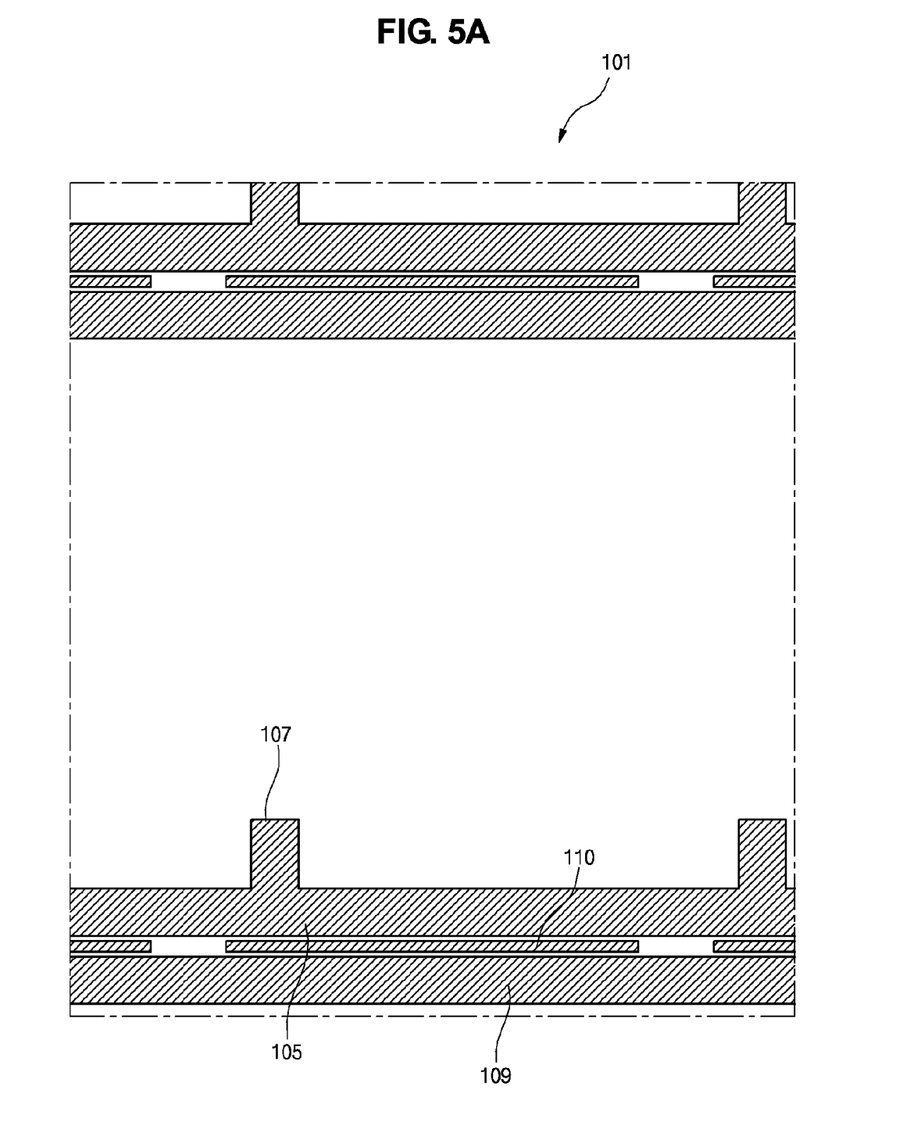
FIGS. 5A to 5D are plane views showing a fabricating process of an array substrate for an LCD device according to the present invention.
Figure 6A:
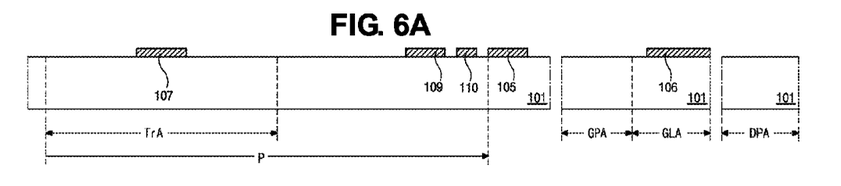
FIGS. 6A to 6L are cross-sectional views showing a fabricating process of an array substrate for an LCD device according to the present invention.

As shown in FIGS. 5A and 6A, a first metal layer (not shown) is formed on the substrate 101 by depositing a first metallic material such as molybdenum (Mo), Mo-titanium alloy (MoTi), chromium (Cr), aluminum (Al) Al alloy (AlNd), copper (Cu) and Cu alloy. Alternatively, the first metal layer may have a multiple-layered structure by depositing at least two of the first metallic material.

The first metal layer is patterned by a mask process to form the gate line 105, the common line 109, the gate electrode 107, a gate link line 106 and a dummy metal pattern 110. The mask process includes a step of forming a photoresist (PR) layer, a step of exposing the PR layer, a step of developing the exposed PR layer to form a PR pattern, and a step of etching the metal layer using the PR pattern. The common line 109 is adjacent to the gate line 105 and spaced apart from the gate line 105. The gate electrode 107 extends from the gate line 105 and is disposed in the switching region TrA. The gate link line 106 is positioned at and connected to an end of the gate line 105. The gate line 106 is disposed in the gate link region GLA. The dummy metal pattern 110 is positioned between the gate line 105 and the common line 109. The dummy metal pattern 110 is disposed at an inner area of the pixel region P. Namely, the dummy metal pattern 110 has a length smaller than a distance between two adjacent data lines 130 to avoid overlapping the data line 130. When the first metal layer has a double-layered structure or a triple-layered structure, each of the gate line 105, the gate electrode 107, the gate link line 106, the common line 109 and the dummy metal pattern 110 has a double-layered structure or a triple-layered structure.

Figure 6B:
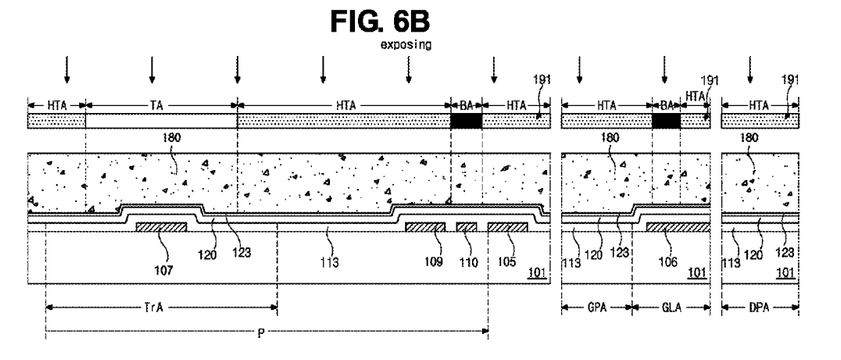

Next, as shown in FIG. 6B, the gate insulating layer 113, an intrinsic amorphous silicon layer 120 and an impurity-doped amorphous silicon layer 123 are stacked on the gate line 105, the gate electrode 107, the gate link line 106, the common line 109 and the dummy metal pattern 110 by sequentially depositing an inorganic insulating material, intrinsic amorphous silicon and impurity-doped amorphous silicon. For example, the inorganic insulating material may includes silicon oxide or silicon nitride.

Next, a PR layer 180 is formed on the impurity-doped amorphous silicon layer 123 by coating a PR material. The PR material has a negative property such that a light-irradiated portion remains after developing process. Alternatively, the PR material having a positive property may be used. In this case, a position of a transmitting area and a blocking area are replaced by each other.

Next, an exposing mask 191 is disposed over the PR layer 180. The exposing mask 191 includes a transmitting area TA, a blocking area BA and a half-transmitting area HTA. The half-transmitting area HTA has transmittance less than that of the transmitting area TA and greater than that of the blocking area BA. The transmitting area TA has a relatively high transmittance, for example, about 100%, so that light through the transmitting area TA can completely change the third PR layer 283 chemically. The blocking area BA shields light completely. The half-transmitting area HTA has a slit structure or a half-transmitting film so that intensity or transmittance of light through the half-transmitting area HTA can be lowered. For example, the half-transmitting area HTA has transmittance with a range between about 10% and about 90%. The transmitting area TA corresponds to the switching region TrA. In other word, the transmitting area TA corresponds to the gate electrode 107. Namely, the transmitting area TA corresponds to a region where the semiconductor layer 128 (of FIG. 4) will be formed. The blocking area BA corresponds to an end of the gate link line 106 and the dummy metal pattern 110. The half-transmitting area HTA corresponds to the other regions. The PR layer 180 is exposed through the exposing mask 191.

Figure 6C:
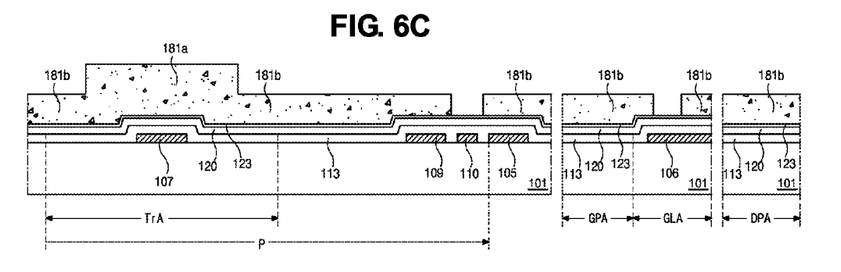

Next, as shown in FIG. 6C, the exposed PR layer 180 is developed to form first and second PR patterns 181a and 181b on the impurity-doped amorphous silicon layer 123. The first PR pattern 181a corresponds to the transmitting area TA of the exposing mask 191 (of FIG. 6B) and has a first thickness. Namely, the first PR pattern 181a corresponds to the gate electrode 107. The PR layer 180 (of FIG. 6B) corresponding to the blocking area BA of the exposing mask 191 is completely removed such that portions of the impurity-doped amorphous silicon layer 123 are exposed through the first and second PR patterns 181a and 181b. Namely, the impurity-doped amorphous silicon layer 123 over the end of the gate link line 106 and the dummy metal pattern 110 is exposed. The second PR pattern 181b corresponds to the half-transmitting area HTA of the exposing mask 191 and has a second thickness smaller than the first thickness.

Figure 6D:
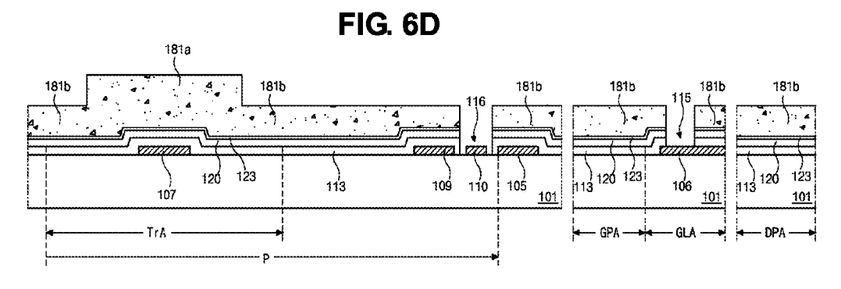

Next, as shown in FIG. 6D, a link contact hole 115 for exposing the end of the gate link line 106 and the groove 116 for exposing the dummy metal pattern 110 are formed through the gate insulating layer 113 by sequentially etching the impurity-doped amorphous silicon layer 123, the intrinsic amorphous silicon layer 120 and the gate insulating layer 113 using the first and second PR patterns 181a and 181b as an etching mask.

Figure 5B:
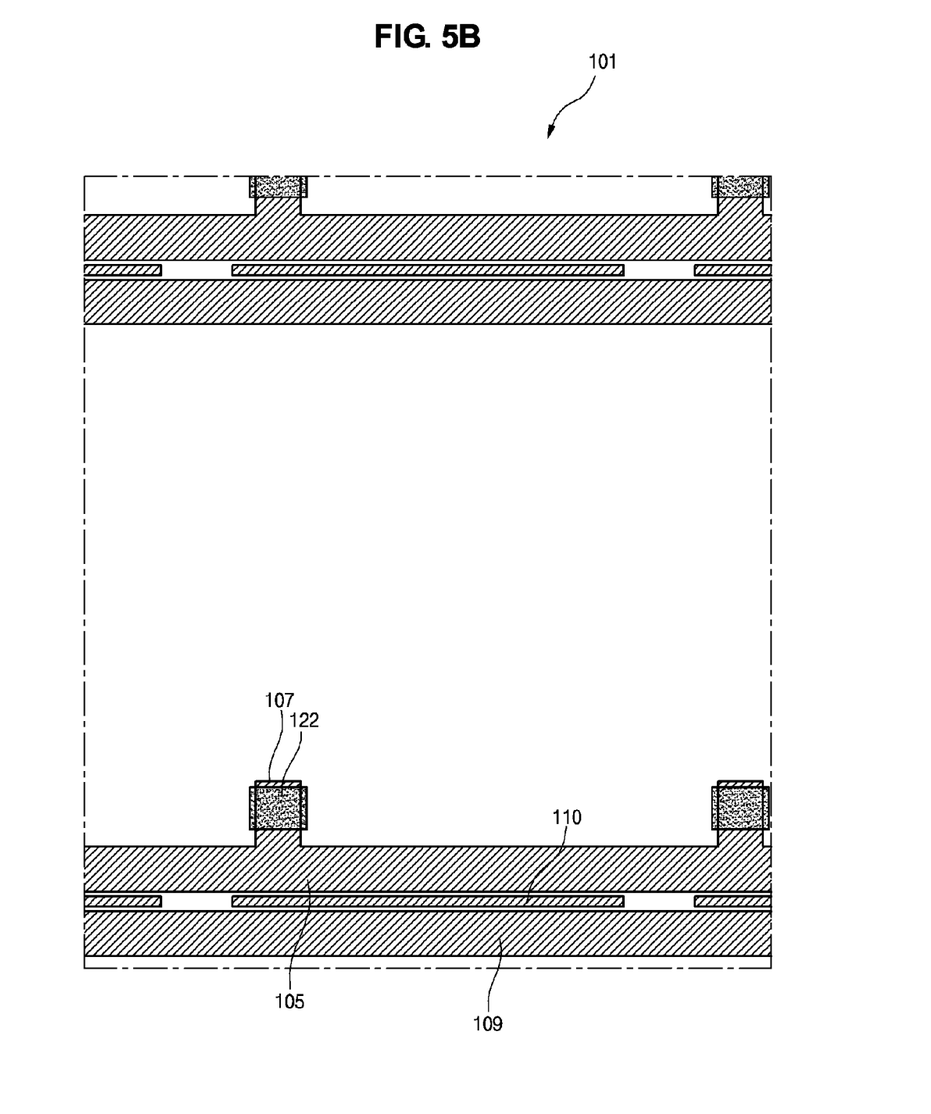
Figure 6E:
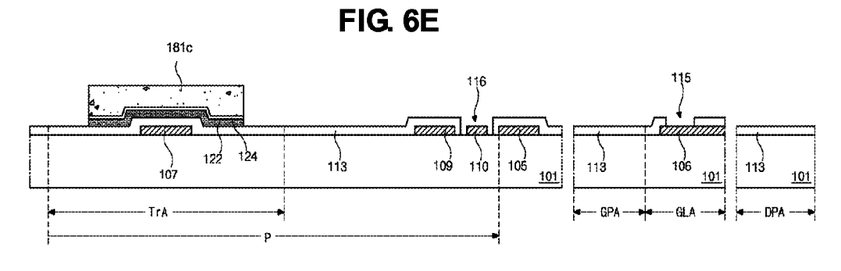

Next, as shown in FIGS. 5B and 6E, by performing an ashing process onto the first and second PR patterns 181a and 181b (of FIG. 6D), the second PR pattern 181b having the second thickness is removed such that the impurity-doped amorphous silicon layer 123 (of FIG. 6D) is exposed. At the same time, a thickness of the first PR pattern 181a is reduced. However, since the first thickness of the first PR pattern 181a is greater than the second thickness of the second PR pattern 181b, there is a third PR pattern 181c in the switching region TrA.

Next, the impurity-doped amorphous silicon layer 123 (of FIG. 6D) and the intrinsic amorphous silicon layer 120 (of FIG. 6D) are etched using the third PR pattern 181c to form the active layer 122 of intrinsic amorphous silicon on the gate insulating layer 113 and an impurity-doped amorphous silicon pattern 124 of impurity-doped amorphous silicon on the active layer 122. At the same time, the gate insulating layer 113 is exposed by etching the impurity-doped amorphous silicon layer 123 (of FIG. 6D) and the intrinsic amorphous silicon layer 120 (of FIG. 6D). As mentioned above, the link contact hole 115 for exposing the end of the gate link line 106 and the groove 116 for exposing the dummy metal pattern 110 are formed through the gate insulating layer 113.

Figure 6F:
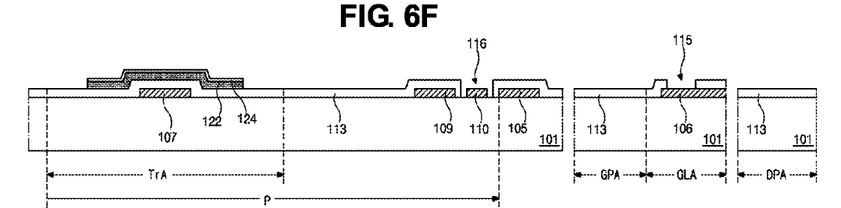

Next, as shown in FIG. 6F, a stripping process is performed onto the third PR pattern 181c (of FIG. 6E) such that the third PR pattern 181c is removed.

Figure 5C:
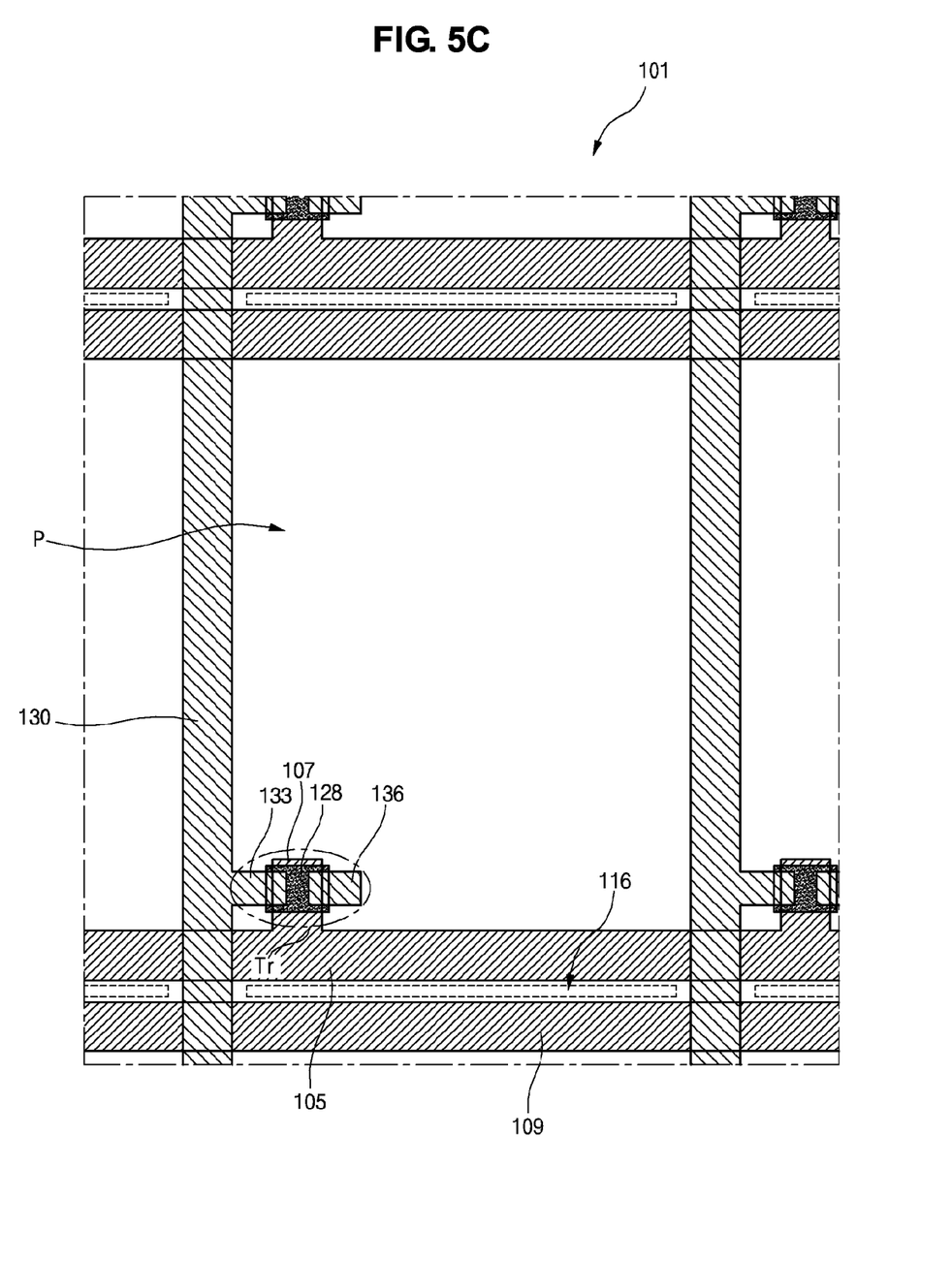
Figure 6G:
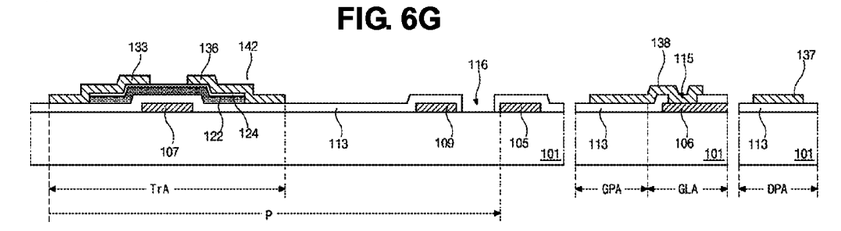

Next, as shown in 5C and 6G, a second metal layer (not shown) is formed on the impurity-doped amorphous silicon pattern 124, the gate insulating layer 113 and the dummy metal pattern 110 (of FIG. 6F) by depositing a second metallic material such as molybdenum (Mo), Mo-titanium alloy (MoTi), chromium (Cr), aluminum (Al) Al alloy (AlNd), copper (Cu) and Cu alloy. Alternatively, the first metal layer may have a multiple-layered structure by depositing at least two of the first metallic material. Since the gate insulating layer 113 has a groove 116 for exposing the dummy metal pattern 110, the second metal layer contacts the dummy metal pattern 110.

The second metallic material for the second metal layer may be same as the first metallic material for the first metal layer. Or, the second metallic material may be etched by an etchant for the first metallic material. For example, when the first metallic material is Al, the second metallic material is Al or Al alloy.

Next, a PR layer (not shown) is formed on the second metal layer. The PR layer on the second metal layer is exposed and developed by a mask process to form a fourth PR pattern (not shown) corresponding to regions where the data line 130, the source electrode 133, the drain electrode 136, a gate pad and a data pad. Namely, the fourth PR pattern is disposed at a boundary of the pixel region P, the switching region TrA, the gate pad area GPA, the gate link area GLA and the data pad area DPA. The third metal layer at the other regions is exposed. Particularly, the second metal layer on the dummy metal pattern 110 is not coved by the fourth PR pattern.

Next, the second metal layer is etched using the fourth PR pattern as an etching mask to form the data line 130, the source electrode 133, the drain electrode 136, the gate pad 138 and the data pad 137. The data line 130 on the gate insulating layer 113 crosses the gate line 105 such that the pixel region P is defined. The data line 130 is connected to the source electrode 133. The source and drain electrodes 133 and 136 are disposed on the impurity-doped amorphous silicon pattern 124 and spaced apart from each other. One end of the impurity-doped amorphous silicon pattern 124 is covered with the source electrode 133, and the other end of the impurity-doped amorphous silicon pattern 124 is covered with the drain electrode 136. The gate pad 138 is disposed in the gate pad area GPA. One end of the gate pad 138 extends into the gate link area GLA to contact the gate link line 106 through the link contact hole 115. The data pad 137 is disposed in the data pad area DPA. The data pad 137 is connected to one end of the data line 130.

When the second metal layer is etched, the dummy metal pattern 110 is also etched such that the substrate 101 is exposed through the groove 116. As mentioned above, since the second metal layer is formed of the same material as the first metal layer or the material being etched by an etchant for the first metal layer, the dummy metal pattern 110 is simultaneously etched with the second metal layer. Accordingly, even if an electrical short problem is generated between two adjacent lines, i.e., the gate line 105 and the common line 109, the dummy pattern 110 on the substrate 101 is removed when the second metal layer is etched such that the electrical short problem is never generated. In addition, an additional mask process for preventing the electrical short problem is not required.

Figure 6H:
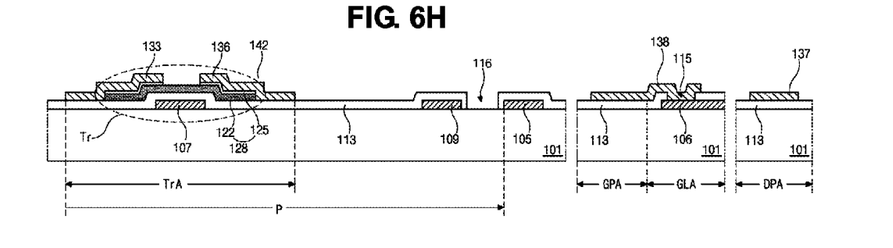

Next, as shown in FIG. 6H, a portion of the impurity-doped amorphous silicon pattern 124 (of FIG. 6G) exposed through a space between the source and drain electrodes 133 and 136 is dry-etched such that the ohmic contact layer 125 from the impurity-doped amorphous silicon pattern 124 is formed on the active layer 122. In addition, a center portion of the active layer 122 is exposed. The active layer 122 and the ohmic contact layer 125 constitute the semiconductor layer 128.

The gate electrode 107, the gate insulating layer 113, the semiconductor layer 128, the source electrode 133 and the drain electrode 136 in the switching region TrA constitute a thin film transistor (TFT) Tr.

Figure 6I:
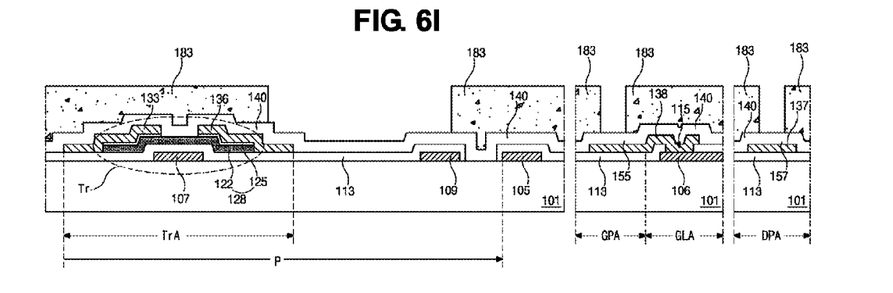

Next, as shown in FIG. 6I, an insulating material layer 140 is formed over the substrate 101, where the data line 130 and the TFT Tr are formed, by depositing an inorganic insulating material such as silicon oxide and silicon nitride. A PR layer (not shown) is formed on the insulating material layer 140. The PR layer is exposed and developed by a mask process to form a fifth PR pattern 183. A portion of the insulating material layer 140, where the pixel electrode 153 (of FIG. 4) will be formed, is not covered by the fifth PR pattern 183. In addition, portions of the insulating material layer 140 at a center of the gate pad area GPA and a center of the data pad area DPA are not coved by the fifth PR pattern 183. Namely, the fifth PR pattern 183 corresponds to the data line 130, the source electrode 133, a portion of the drain electrode 136, the gate line 105, both sides of the gate pad area GPA, the gate link area GLA and both sides of the data pad area DPA.

Figure 6J:
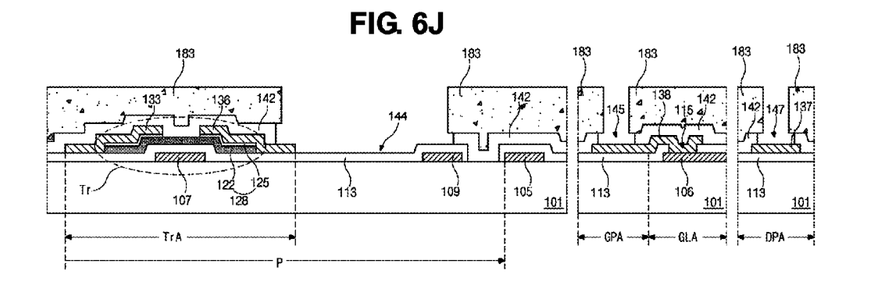

Next, as shown in FIG. 6J, the exposed portions of the insulating material layer 140 are etched using the fifth PR pattern 193 as an etching mask to form an opening 144 in the pixel region P, a gate pad contact hole 145 in the gate pad area GPA and a data pad contact hole 147 in the data pad area DPA. The other portions of the insulating material layer 140 under the fifth PR pattern 183 remains after the etching process to form a passivation layer 142. A portion of the gate insulating layer 113 in the pixel region P is exposed through the opening 144. In addition, an end of the drain electrode 136 is exposed through the opening 144. The gate pad 138 is exposed through the gate pad contact hole 145, and the data pad 137 is exposed through the data pad contact hole 147. The other portions of the insulating material layer 140 under the fifth PR pattern 183 remains after the etching process to form a passivation layer 142.

In this case, to completely remove the insulating material layer 140 on the gate pad 138 and the data pad 137, the insulating material layer 140 is over-etched. As a result, the passivation layer 142 has an under-cut shape with respect to the fifth PR pattern 183. Namely, the passivation layer 142 has a width smaller than the fifth PR pattern 183. As explained below, because the passivation layer 142 has the under-cut shape, a lift-off process for forming a pixel electrode and removing the fifth PR pattern 183 can be processed by a single mask process.

Figure 6K:
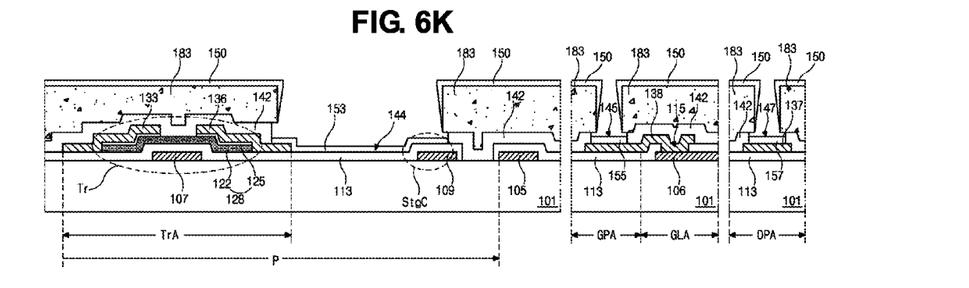

Next, as shown in FIG. 6K, a transparent conductive material, for example, indium-tin-oxide (ITO) or indium-zinc-oxide (IZO), is deposited over the substrate 101, where the fifth PR pattern 183 is formed, to form a transparent conductive material layer 150, a pixel electrode 153 in the pixel region P, a gate pad electrode 155 in the gate pad area GPA and a data pad electrode 157 in the data pad area DPA. The transparent conductive material layer 150 covers an upper surface and side surfaces of the fifth PR pattern 183. The pixel electrode 153 is disposed in the opening 144 to be disposed on the gate insulating layer 113. The pixel electrode 153 contacts the end of the drain electrode 136 and overlaps the common line 109 to form a storage capacitor StgC. Namely, the overlapped portion of the common line 109, the overlapped portion of the pixel electrode 153 and the gate insulating layer between the common line 109 and the pixel electrode 153 constitute the storage capacitor StgC. The gate pad electrode 155 contacts the gate pad 138 through the gate pad contact hole 145. The data pad electrode 157 contacts the data pad 137 through the data pad contact hole 147.

Each of the transparent conductive material layer 150, the pixel electrode 153, the gate pad electrode 155 and the data pad electrode 157 has a thickness smaller than the passivation layer 142. As mentioned above, since the passivation layer 142 has the under-cut shape with respect to the fifth PR pattern 183, there are discontinuous parts at boundaries between the transparent conductive material layer 150 and each of the pixel electrode 153, the gate pad electrode 155 and the data pad electrode 157. As a result, portions of the fifth PR pattern 183 are exposed through the discontinuous parts. If each of the transparent conductive material layer 150, the pixel electrode 153, the gate pad electrode 155 and the data pad electrode 157 has a thickness greater than the passivation layer 142, the discontinuous parts are not generated.

Figure 5D:
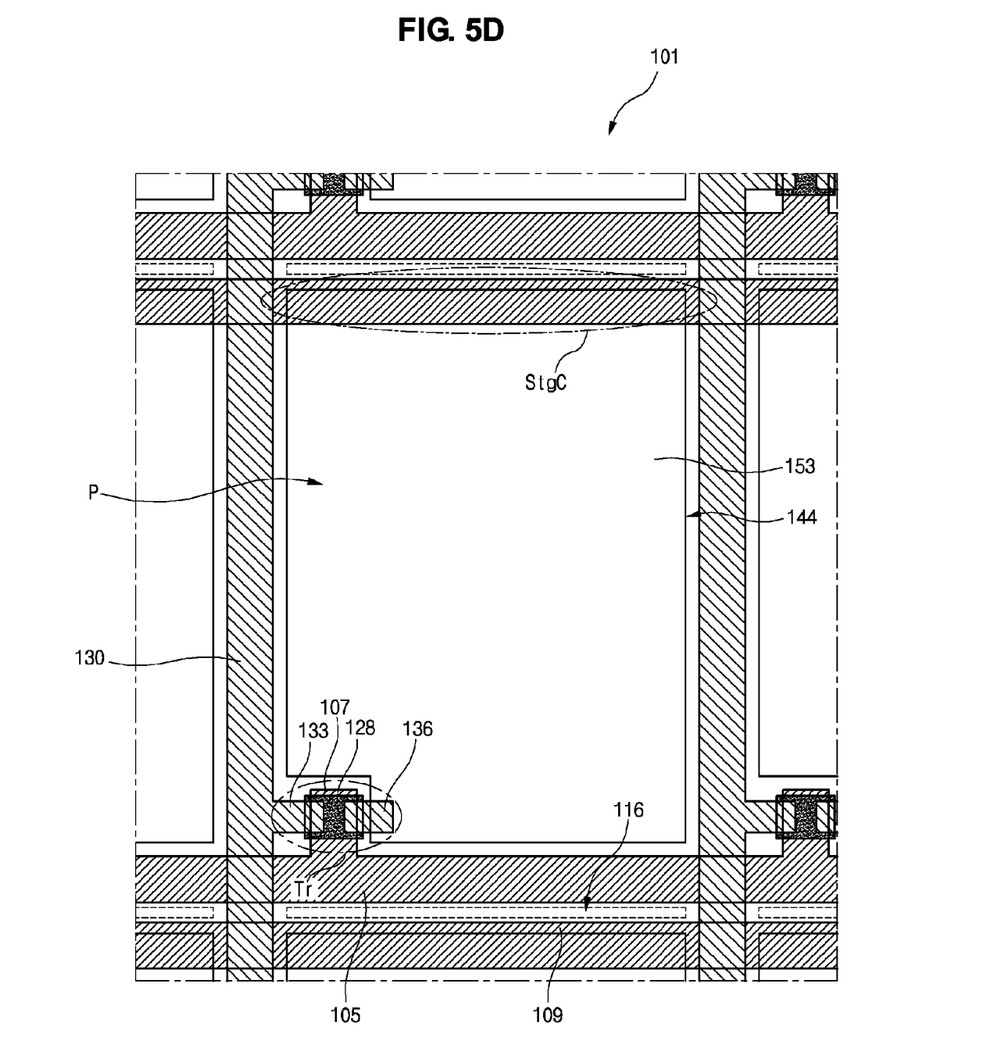
Figure 6L:
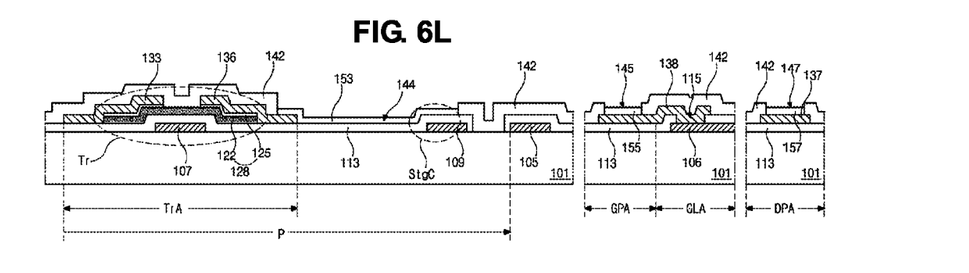

Next, as shown in FIGS. 5D and 6L, the substrate 101, where the fifth PR pattern 183 (of FIG. 6K), the transparent conductive material layer 150, the pixel electrode 153 (of FIG. 6K), the gate pad electrode 155 and the data pad electrode 157 are formed, is dipped into a stripping solution such that the fifth PR pattern 183 (of FIG. 6K) is exposed to the stripping solution. Alternatively, a stripping solution may be sprayed onto the substrate 101. The stripping solution reacts a material of the fifth PR pattern 183 exposed through the discontinuation parts. The stripping solution penetrates into an interface between the fifth PR pattern 183 and the passivation layer 142 such that an adhesive strength between the fifth PR pattern 183 and the passivation layer 142 is weakened. As a result, the fifth PR pattern 183 is removed from the passivation layer 142. At the same time, the transparent conductive material layer 150 on the fifth PR pattern 183 is also removed with the fifth PR pattern 183. The above process may be called as a lift-off process. The pixel electrode 153, the gate pad electrode 155 and the data pad electrode 157 remain after the lift-off process.

In the present invention, the passivation layer 142, the pixel electrode 153, the gate pad electrode 155 and the data pad electrode 157 are formed by a single mask process through the lift-off process. As a result, the array substrate according to the present invention can be obtained by a four mask process. In addition, an electrical short problem between adjacent lines, i.e., the gate line 105 and the common line 109, at the same layer, is not generated due to the groove 116 through the gate insulating layer 113. This is adopted to other adjacent lines, i.e., two closely adjacent gate lines. Furthermore, since an additional mask process is not required for the groove 116, there is no increase in the fabricating process and the production costs. Moreover, since a laser repair process is not required to resolve the electrical short problem, production yield is increase.

On the other hand, the dummy metal pattern 110 may be omitted. Namely, the gate line 105, the gate electrode 107, the common line 109, the gate link line 106 except the dummy metal pattern are formed from the first metal layer. In this case, when the groove 116 is formed by etching the impurity-doped amorphous silicon layer 123, the intrinsic amorphous silicon layer 120 and the gate insulating layer 113, the substrate 101 is directly exposed through the groove 116. In addition, the second metal layer for the data line 130, the source electrode 133 and the drain electrode 136 contacts the substrate 101 through the groove not the dummy metal pattern. When the electrical short problem is generated between the gate line 105 and the common line 109, an electrical short portion is removed by not only the step of forming the groove but also the step of forming the data line 130, the source electrode 133 and the drain electrode 136. As a result, the electrical short problem is resolved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents. and

What is claimed is:

1. A method of fabricating an array substrate for a liquid crystal display device, comprising:

forming a first line, and a second line and a gate electrode on a substrate, the first and second lines spaced apart from each other, the gate electrode connected to the gate line, the first line, the second line and the gate electrode formed of a first metallic material;

forming a gate insulating layer on the first and second lines and the gate electrode, an active layer on the gate insulating layer and an impurity-doped amorphous silicon pattern on the active layer, the gate insulating layer including a groove, the active layer and the impurity-doped amorphous silicon pattern corresponding to the gate electrode, wherein the groove exposes the substrate and is positioned between the first and second lines;

forming a data line on the gate insulating layer and source and drain electrodes on the impurity-doped amorphous silicon pattern, the data line crossing the first and second lines, the source electrode connected to the data line and spaced apart from the drain electrode;

etching a portion of the impurity-doped amorphous silicon pattern using the source and drain electrode as an etching mask;

forming a passivation layer, which is disposed on the data line, the source electrode and the drain electrode and includes an opening exposing a portion of the gate insulating layer and an end of the drain electrode, and a pixel electrode on the gate insulating layer and in the opening, wherein the pixel electrode contacts the end of the drain electrode; and wherein the step of forming the first line, the second line and the gate electrode includes forming a dummy metal pattern in the groove.

2. The method according to claim 1, wherein the step of forming the passivation layer and the pixel electrode includes:

forming an insulating material layer over the substrate where the data line, the source electrode and the drain electrode are formed;

forming a photoresist (PR) pattern on the insulating material layer and corresponding to the data line, the source electrode, a portion of the drain electrode and the first line;

etching the insulating material layer using the PR pattern as an etching mask to form a passivation layer, the passivation layer has an under-cut shape with respect to the PR pattern;

depositing a transparent conductive material to form a transparent conductive material layer covering the PR pattern, the pixel electrode; and removing the PR pattern and the transparent conductive material layer by a lift-off process.

3. The method according to claim 2, wherein a thickness of the pixel electrode is smaller than the passivation layer.

4. The method according to claim 1, wherein the step of forming the data line, the source and drain electrodes includes;

forming a first metal layer on the gate insulating layer and the impurity-doped amorphous silicon pattern; and etching the first metal layer to form the data line and the source and drain electrodes and the dummy metal pattern to expose the substrate through the groove.

5. The method according to claim 4, wherein each of the data line, the source electrode and the drain electrode is formed of a second metallic material being same as or being etched by an etchant for a material of the dummy metal pattern.

6. The method according to claim 1, wherein the step of forming the gate insulating layer, the active layer and the impurity-doped amorphous silicon pattern includes:

sequentially forming a gate insulating layer, an intrinsic amorphous silicon layer and an impurity-doped amorphous silicon layer on the first line, the second line and the gate electrode;

forming first and second PR pattern on the impurity-doped amorphous silicon layer, the first PR pattern corresponding to the gate electrode and having a first thickness greater than the second PR pattern, a portion of the impurity-doped amorphous silicon layer corresponding to the groove is exposed through the second PR pattern;

etching the impurity-doped amorphous silicon layer, the intrinsic amorphous silicon layer and the gate insulating layer using the first and second PR pattern as an etching mask to form the groove;

ashing the first and second PR pattern to remove the second PR pattern and form a third PR pattern from the first PR pattern;

etching the impurity-doped amorphous silicon layer and the intrinsic amorphous silicon layer using the third PR pattern as an etching mask to form the active layer and the impurity-doped amorphous silicon pattern; and removing the third PR pattern.

7. The method according to claim 1, wherein a width of the groove is smaller than a distance between the first and second lines.

8. The method according to claim 1, wherein a length of the groove is smaller than a distance between two adjacent data lines.

9. The method according to claim 1, wherein the passivation layer contacts the substrate at the groove.

10. The method according to claim 1, wherein the step of forming the first line, the second line and the gate electrode includes forming a gate link line on the substrate and connected to an end of the gate line, the gate insulating layer further including a link contact hole, the link contact hole exposing the gate link line, wherein the step of forming the data line and the source and drain electrode includes forming a gate pad and a data pad on the gate insulating layer, the gate pad contacting the gate link line through the link contact hole, the data pad connected to an end of the data line, wherein the step of forming the passivation layer and the pixel electrode includes forming a gate pad electrode and a data pad electrode on the passivation layer, and wherein a gate pad contact hole exposing the gate pad and a data pad contact hole exposing the data pad are formed through the passivation layer, and the gate pad electrode and the data pad electrode respectively contact the gate pad and the data pad through the gate pad contact hole and the data pad contact hole.

* * * * *